United States Patent [19]

Nadahara et al.

[11] Patent Number: 5,885,905
[45] Date of Patent: Mar. 23, 1999

[54] SEMICONDUCTOR SUBSTRATE AND METHOD OF PROCESSING THE SAME

[75] Inventors: Souichi Nadahara, Poughkeepsie, N.Y.; Kikuo Yamabe; Hideyuki Kobayashi, both of Yokohama, Japan; Kunihiro Terasaka, Tokyo, Japan; Akihito Yamamoto, Kanagawa-ken, Japan; Naohiko Yasuhisa, Ooita-ken, Japan

[73] Assignee: Kabushiki Kaisha Toshiba, Kawasaki, Japan

[21] Appl. No.: 582,975

[22] Filed: Jan. 4, 1996

Related U.S. Application Data

[62] Division of Ser. No. 91,266, Jul. 15, 1993, Pat. No. 5,502,010.

[30] Foreign Application Priority Data

| Jul. 17, 1992 | [JP] | Japan | 4-191118 |
| Dec. 28, 1992 | [JP] | Japan | 4-349538 |

[51] Int. Cl.$^6$ .......... H01L 21/324; H01L 21/477
[52] U.S. Cl. .......... 438/795; 438/799
[58] Field of Search .......... 438/795, 799

[56] References Cited

U.S. PATENT DOCUMENTS

| 3,925,107 | 12/1975 | Gdula et al. | 148/1.5 |
|---|---|---|---|
| 3,997,368 | 12/1976 | Petroff et al. | 148/1.5 |
| 4,116,719 | 9/1978 | Shimizu et al. | 148/1.5 |
| 4,220,483 | 9/1980 | Cacgarra | 148/1.5 |
| 4,314,595 | 2/1982 | Yamamoto et al. | 21/322 |
| 4,376,657 | 3/1983 | Nagasawa et al. | 148/1.5 |
| 4,503,087 | 3/1985 | Russo | 438/795 |
| 4,505,759 | 3/1985 | O'Mara | 148/1.5 |
| 4,547,256 | 10/1985 | Gurtler et al. | 156/603 |
| 4,548,654 | 10/1985 | Tobin | 148/1.5 |
| 4,597,804 | 7/1986 | Imaoka | 148/1.5 |
| 4,622,082 | 11/1986 | Dyson et al. | 148/33 |
| 4,626,450 | 12/1986 | Tani et al. | 427/93 |
| 4,637,123 | 1/1987 | Cazcarra et al. | 29/569 R |
| 4,666,532 | 5/1987 | Korb et al. | 148/1.5 |
| 4,681,983 | 7/1987 | Makrvalt et al. | 136/255 |
| 4,713,354 | 12/1987 | Egawa et al. | 437/22 |
| 5,009,926 | 4/1991 | Fukada | 427/55 |
| 5,061,642 | 10/1991 | Fujioka | 437/11 |
| 5,094,963 | 3/1992 | Hiraguchi et al. | 437/12 |
| 5,096,839 | 3/1992 | Amai et al. | 437/10 |
| 5,110,404 | 5/1992 | Fusegawa et al. | 438/795 |
| 5,286,658 | 2/1994 | Shirakawa et al. | 437/10 |
| 5,327,007 | 7/1994 | Imura et al. | 257/610 |
| 5,385,115 | 1/1995 | Tomioka et al. | 117/2 |
| 5,401,669 | 3/1995 | Falster et al. | 438/799 |
| 5,403,406 | 4/1995 | Falster et al. | 148/33.2 |
| 5,445,975 | 8/1995 | Gardner et al. | 437/10 |
| 5,502,010 | 3/1996 | Nadahara et al. | 437/247 |

FOREIGN PATENT DOCUMENTS

| 2080780 | 7/1981 | European Pat. Off. . |
| 0 606 676 | 9/1982 | European Pat. Off. . |
| 33 45 075 | 7/1984 | Germany . |
| 60-42839 | 3/1985 | Japan . |
| 2-105410 | 4/1990 | Japan . |
| 2-138729 | 5/1990 | Japan . |
| 5-144828 | 6/1993 | Japan . |
| 5-182975 | 7/1993 | Japan . |

OTHER PUBLICATIONS

Wolf, Stanley, *Silicon Processing for the VLSI Era*, vol. 1, pp. 66–69. 1986 No Month.

Appl. Phys. Lett., vol. 46, No. 5, pp. 516–518, Mar. 1, 1985, Kenji Wishi, et al, "Fast Shrinkage of Oxidation–Induced Stacking Faults in Silicon at the Initial Stage of Annealing in Nitrogen".

*Primary Examiner*—Charles Bowers
*Assistant Examiner*—Matthew Whipple
*Attorney, Agent, or Firm*—Oblon, Spivak, McClelland, Maier & Neustadt, P.C.

[57] ABSTRACT

A method of processing a semiconductor substrate includes the step of subjecting a semiconductor substrate to a heat treatment under a gaseous atmosphere. The method comprises the step of subjecting a semiconductor substrate to a heat treatment at temperatures not lower than 1100° C. under a non-oxidizing atmosphere, wherein heat treatments before said heat treatment applied to the semiconductor substrate are applied under heat treating temperatures and heat treating time which fall within a region defined by a line connecting four points of (900° C., 4 minutes), (800° C., 40 minutes), (700° C., 11 hours) and (600°0 C., 320 hours) in a graph, in which the heat treating temperature is plotted on the abscissa and the heat treating time is plotted on the ordinate of the graph.

8 Claims, 6 Drawing Sheets

SEMICONDUCTOR SUBSTRATE AND METHOD OF PROCESSING THE SAME

This is a division of application Ser. No. 08/091,266 filed on Jul. 15, 1993 now U.S. Pat. No. 5,502,010.

BACKGROUND OF THE INVENTION

1. Field of the Invention

The present invention relates to a semiconductor substrate capable of preventing deterioration of element characteristics and a method of processing said substrate.

2. Description of the Related Art

In recent years, LSI is widely used in important portions of an electronic computer, a communication equipment, etc. It should be noted that a silicon wafer used for the manufacture of the LSI has a mirror-finished surface.

In preparing a silicon wafer having a mirror-finished surface, a columnar silicon crystal prepared by a CZ method is cut in the first step to obtain a circular silicon wafer. Then, the surface of the silicon wafer thus obtained is lapped, etched or polished to obtain a silicon wafer having a desired thickness. Finally, the resultant silicon wafer is washed with an acidic solution or an organic solvent so as to obtain a desired silicon wafer having a mirror-finished surface.

Figure 10:
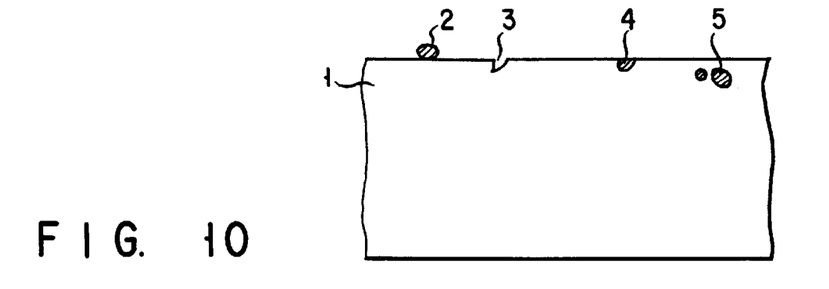
FIG. 10 is a cross sectional view showing a silicon wafer for describing problems inherent in the prior art.

However, the conventional method outlined above gives rise to serious defects. Specifically, if a silicon wafer is oxidized at a temperature of, for example, about 950° to 1100° C., about 10 to 100 OSF (Oxidation induced Stacking Fault)/cm$^2$ are formed on the mirror-finished surface. FIG. 10 shows the cause of the OSF formation in a surface region of a silicon wafer 1. Specifically, the OSF formation is considered to be caused by a contaminant 2, a fine scratch 3, a foreign matter 4 such as $SiO_2$ or SiC, and a micro defect 5 such as a swirl within a silicon wafer 1 or an oxygen precipitates.

If an element is formed in a silicon wafer having such an OSF, a junction leakage takes place so as to deteriorate the element characteristics.

What should also be noted is that, where a columnar silicon crystal is manufactured by the CZ method, an excessive oxygen is dissolved from the crucible into the columnar silicon crystal in the step of the crystal is growth. The excessive oxygen causes BMD (Bulk Micro Defect) sized about 0.1 to 1.0 $\mu$m.

Figure 11A:
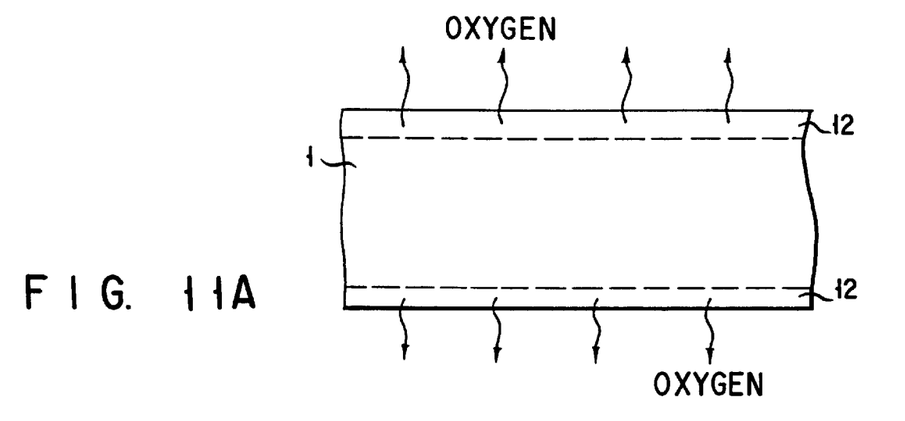
FIGS. 11A to 11C collectively show the oxygen precipitate behavior.
Figure 11B:
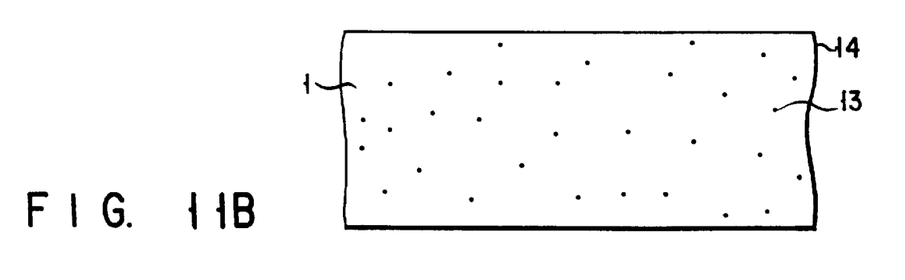
Figure 11C:
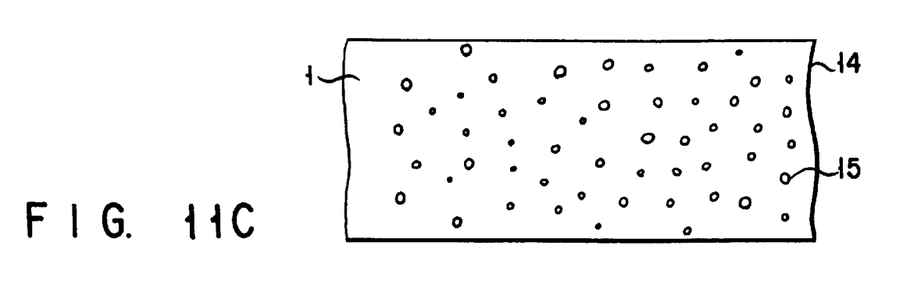

The BMD is generated in the manufacture of, for example, a CMOS device having a well structure. To be more specific, a p-well or an n-well is formed in a silicon wafer 1 in the initial step of the process for manufacturing a CMOS device of this type. In forming the p-well or n-well, an impurity is thermally diffused into a surface region of the silicon wafer at temperatures not lower than 1100° C. During the thermal diffusion, the oxygen in, particularly, the surface region of the silicon wafer 1 is diffused outward, with the result that a defect-free layer 12 called DZ (Denuded Zone) is formed in the surface region of the silicon wafer as shown in FIG. 11a. Then, the silicon wafer 1 is subjected to heat treatments at a temperature of about 800° C. in various subsequent steps including, for example, the step of forming a silicon nitride film by LPCVD method. During these heat treatments, nuclei 13 of oxygen precipitates are ideally formed in an intermediate layer 14 within the silicon wafer 1, as shown in FIG. 11b. Further, the silicon wafer 1 is subjected to a heat treatment at a temperature of about 1000° C. in the subsequent step of, for example, forming a field oxide film, with the result that precipitate grows about each of the nuclei 13 to form BMD 15 with a high concentration.

The BMD generation described above is greatly affected not only by the heat history of the silicon wafer but also by the carbon concentration, the pull-up condition in the stage of the crystal growth for manufacturing the columnar silicon crystal, etc. Presently, fine oxygen precipitate, which is brought about in the stage of pulling the columnar silicon crystal, is considered to provide the nucleus for the BMD formation. The size and number of precipitates are not uniform within the silicon wafer. Thus, in forming the DZ layer, the oxygen concentration in the surface region of the silicon wafer is lowered as much as possible by the outer diffusion of oxygen such that oxygen is no more precipitated.

The heat treatment for the outer diffusion of oxygen is carried out in general under an oxidizing atmosphere. To be more specific, if a silicon wafer is subjected to a heat treatment under a non-oxidizing gaseous atmosphere, e.g., under a nitrogen gas atmosphere, the wafer surface is nitrided nonuniformly, leading to a surface roughening. Also, in the case of employing an inert gas atmosphere, a non-uniform etching takes place on the wafer surface unless a sufficient purity of the inert gas is ensured. The surface roughening noted above takes place in this case, too. Such being the situation, the heat treatment for the outer diffusion of oxygen is carried out in general under an oxidizing atmosphere, as described above.

However, in the case of the heat treatment under an oxidizing atmosphere, an oxide film is formed on the wafer surface, making it impossible to lower sufficiently the oxygen concentration in the surface region of the wafer. It follows that it is difficult to suppress sufficiently the precipitate generation, resulting in failure to form a satisfactory DZ layer. If a thin oxide film such as a gate oxide film is formed on the surface of a silicon wafer having such an unsatisfactory DZ layer, weak spots are generated so as to lower the breakdown voltage of the oxide film. It may be desirable to form a DZ layer extending deep into the silicon wafer by carrying out the outer diffusion of oxygen over a long time. In this case, however, the concentration of oxygen atoms forming a solid solution within the silicon wafer is lowered, leading to reduction in the mechanical strength of the substrate. Further, crystal defects are generated within the active region of the semiconductor element formed in the wafer.

SUMMARY OF THE INVENTION

A first object of the present invention is to provide a method of processing a semiconductor substrate, the method making it possible to suppress the generation of BMD or OSF which causes deterioration of the element characteristics.

A second object of the present invention is to provide a semiconductor substrate, which does not bring about generation of BMD or OSF which causes deterioration of the element characteristics.

According to a first aspect of the present invention for achieving the first object, there is provided a method of processing a semiconductor substrate including the step of subjecting a semiconductor substrate to a heat treatment under a gaseous atmosphere, comprising the step of subjecting a semiconductor substrate to a heat treatment at temperatures not lower than 1100° C. under a non-oxidizing atmosphere, wherein heat treatments before the heat treatment applied to the semiconductor substrate are applied under heat treating temperatures and heat treating time which fall within a region defined by a line connecting four points of (900° C., 4 minutes), (800° C., 40 minutes), (700° C., 11 hours) and (600° C., 320 hours) in a graph, in which the heat treating temperature is plotted on the abscissa and the heat treating time is plotted on the ordinate of the graph.

The coordinate points of the heat treating temperature and time in the graph, which are positioned on the line connecting the four points noted above, are included in the technical scope of the present invention.

It has been found by an extensive research made by the present inventors that the generation and OSF and BMD can be suppressed sufficiently, if the heat treating temperature and time are chosen to fall within the particular region defined as above. It follows that the method of the present invention for processing a semiconductor substrate makes it possible to form a satisfactory oxide film on the surface of a substrate.

According to a second aspect of the present invention, there is provided a method of processing a semiconductor substrate, comprising the steps of introducing silicon atoms into regions between lattices within a silicon substrate and outwardly diffusing oxygen contained in the silicon substrate; and subjecting the silicon substrate to a heat treatment under a non-oxidizing atmosphere.

In the method according to the second aspect of the present invention, silicon atoms are preferentially introduced into regions between the lattices in a silicon substrate, with the result that oxygen is unlikely to be precipitated in regions within the lattices of the silicon substrate. Also, since oxygen in the silicon substrate is outwardly diffused, the oxygen concentration in the region between the lattices in the surface region of the silicon substrate can be lowered while suppressing the oxygen precipitate. Further, the heat treatment performed under a non-oxidizing atmosphere makes it possible to repair micro defects and to permit outward diffusion of oxygen. It follows that it is possible to obtain a silicon substrate which is small in its substrate defects such as BMD.

According to a third aspect of the present invention, there is provided a method of processing a semiconductor substrate, comprising the steps of subjecting a semiconductor substrate to a heat treatment at a temperature not lower than 1100° C. under an oxidizing atmosphere so as to form an oxide film on the surface of the silicon substrate; and removing the oxide film to expose the surface of the silicon substrate, followed by subjecting the silicon substrate with the exposed surface to a heat treatment under a non-oxidizing atmosphere.

The non-oxidizing atmosphere employed in the method according to the third aspect of the present invention includes not only an inert gas atmosphere such as an argon gas atmosphere but also an atmosphere which does not bring about an undesired reaction with the substrate surface and an atmosphere which does not do damage to the substrate surface.

In the method according to the third aspect of the present invention, an oxide film is formed by a heat treatment under an oxidizing atmosphere under temperatures not lower than 1100° C. In the step of the oxidation, volume enhancement takes place in a surface region of the silicon substrate so as to bring about a re-arrangement of the silicon crystal. What should be noted is that silicon atoms which have not been oxidized are migrated into an inner region of the silicon substrate, with the result that silicon atoms are introduced into regions between lattices of the silicon crystal. At the same time, oxygen atoms within the silicon substrate are outwardly diffused so as to diminish the oxygen precipitates within the silicon substrate. What should also be noted is that the heat treatment carried out under a non-oxidizing atmosphere permits repairing micro defects and also permits further diffusing oxygen to the outside. It follows that it is possible to obtain a silicon substrate with diminished substrate defects such as BMD.

According to a fourth aspect of the present invention, which is directed to the second object described previously, there is provided a semiconductor substrate, comprising a first region defined between the upper surface and a plane having a depth of 10 $\mu$m as measured from the upper surface, the first region having a defect density not higher than $10^7$ defects/cm$^3$, and a second region defined between the center plane of the semiconductor substrates and a plane having a depth of 50 $\mu$m as measured from the upper surface, the second region having a constant defect density falling within a range of between $10^7$ defects/cm$^3$ and $10^9$ defects/cm$^3$, the defect density within the region positioned between the first and second regions being distributed such that the defect density is decreased with decrease in the distance from the upper surface. The term "defect" noted above represents a substrate defect such as BMD.

According to the research conducted by the present inventors, a semiconductor substrate having a defect density distribution defined as above makes it possible to prevent element characteristics from being deteriorated by substrate defects such as BMD.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Let us describe some embodiments of the present invention with reference to the accompanying drawings. In the first step, a silicon wafer is oxidized under a dry atmosphere at 780° C. for 3 hours and, then, at 1000° C. for 16 hours so as to obtain a silicon wafer having an OSF density of $2 \times 10^3/cm^2$. Then, the resultant silicon wafer is subjected to a heat treatment under an inert gas atmosphere such as an argon gas or a helium gas at 1200° C. for 1 to 8 hours. After the heat treatment under an inert gas atmosphere, the silicon wafer is oxidized at 780° C. for 3 hours under a dry atmosphere, followed by an additional oxidizing treatment at 1000° C. for 16 hours under a dry atmosphere. Then, the silicon wafer surface is etched to some extent.

Figure 1:
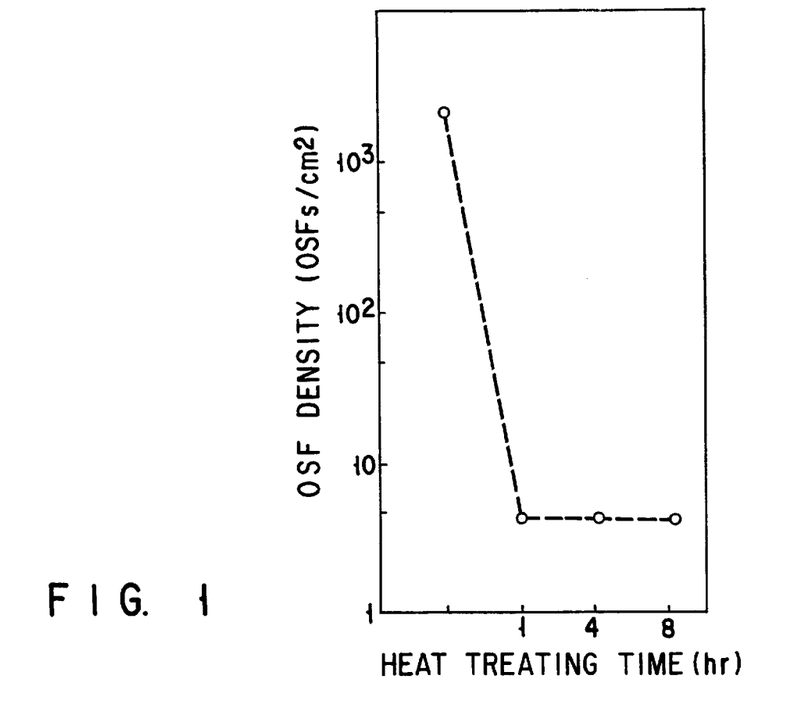
FIG. 1 is a graph showing the relationship between the heat treating time and an OSF density.

The silicon wafer thus obtained was observed with an optical microscope, with the result that the OSF density was found to be about 4 OSFs/$cm^2$, as shown in FIG. 1. In other words, the heat treatment under an inert gas atmosphere was found to be effective for decreasing the OSF density. On the other hand, a silicon wafer to which the heat treatments described above, i.e., the heat treatment at 780° C. for 3 hours and the subsequent heat treatment at 1000° C. for 16 hours, had not been applied was found to have an OSF density of about 0.6 OSF/$cm^2$. In other words, the OSF density was found to be substantially zero.

In the embodiment described above, the heat treatment is substantially applied to a wafer having the surface not covered with a protective film such as an oxide film. Thus, if the inert gas atmosphere contains an oxygen, nitrogen or carbon-based gas as an impurity, the wafer surface tends to be roughened. To overcome the difficulty, it is desirable to suppress the concentration of the oxygen, carbon, nitrogen or carbon-based gas in the inert gas atmosphere to a level of 10 ppb or less.

Let us describe another embodiment of the present invention. Specifically, when it comes to a CMOS device having a well structure, a p-well or an n-well is formed in the initial step of manufacturing the device. Thus, an impurity is thermally diffused into a surface region of a silicon wafer by a heat treatment at temperatures not lower than 1000° C. for several hours under a non-oxidizing atmosphere. In the thermal diffusion step, the oxygen atoms contained in a surface region of the silicon wafer are outwardly diffused so as to form a DZ layer in the surface region of the silicon wafer. Then, the silicon wafer is subjected to various processing steps including the step of forming a nitride film by an LPCVD method. Naturally, the silicon wafer is subjected to heat treatments several times at about 600° to 800° C., with the result that nuclei for oxygen precipitate are formed within the silicon wafer. It is most desirable for the nuclei for the oxygen precipitate to be formed in the intermediate layer inside the silicon wafer. When the silicon wafer is subjected to a subsequent heat treatment at about 1000° C. in the step of forming, for example, a field oxide film, the oxygen precipitate grows about the nucleus. As a result, BMD is formed with a high density over the entire region of the silicon wafer. The nucleus formation for the oxygen precipitate is greatly affected by not only the heat history of the silicon wafer but also the carbon concentration, the pull-up condition in the stage of the crystal growth, etc. It follows that the size and the number of precipitates are nonuniform within the silicon wafer.

Figure 2:
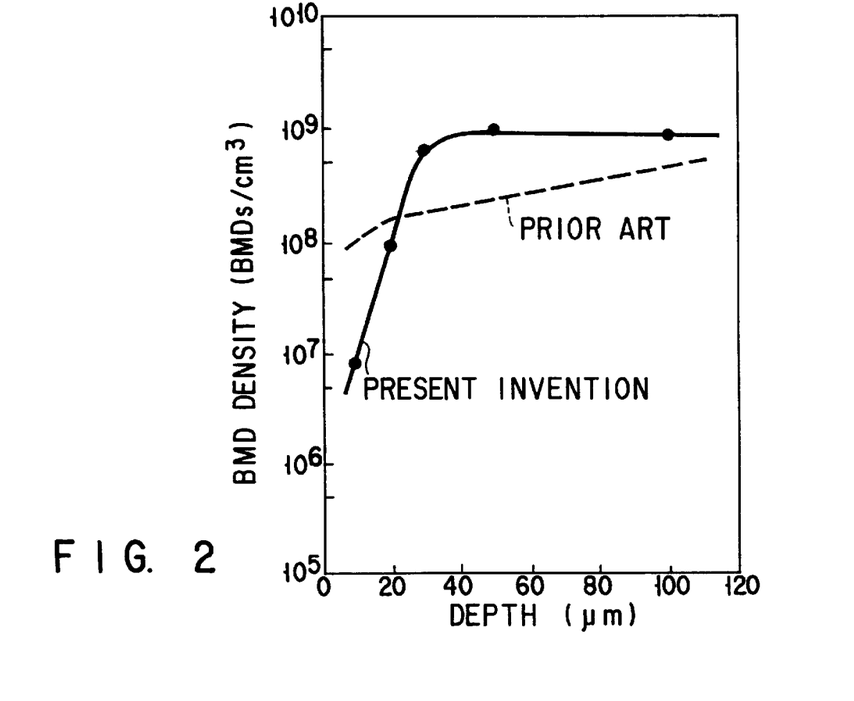
FIG. 2 is a graph showing the relationship between the depth and a BMD density.

In order to suppress the BMD generation, a heat treatment is applied before the steps described above to the silicon wafer at 1200° C. for 4 hours under an argon gas atmosphere. FIG. 2 shows the relationship between the depth from the silicon wafer surface and the BMD density. A solid line shown in FIG. 2 represents a silicon wafer to which is applied the heat treatment under the argon gas atmosphere noted above. For comparison, FIG. 2 also includes a broken line representing the conventional silicon wafer to which the heat treatment under an argon gas atmosphere is not applied.

FIG. 2 clearly shows that the silicon wafer of the present invention (solid line) has a BMD density much lower than that of the conventional silicon wafer in the surface region having a depth not larger than 20 $\mu$m as measured from the surface. In addition, the BMD density in the surface region having a depth not larger than 10 $\mu$m is as low as $1 \times 10^7$ BMDs/$cm^3$ or less, in the silicon wafer of the present invention.

Figure 3:
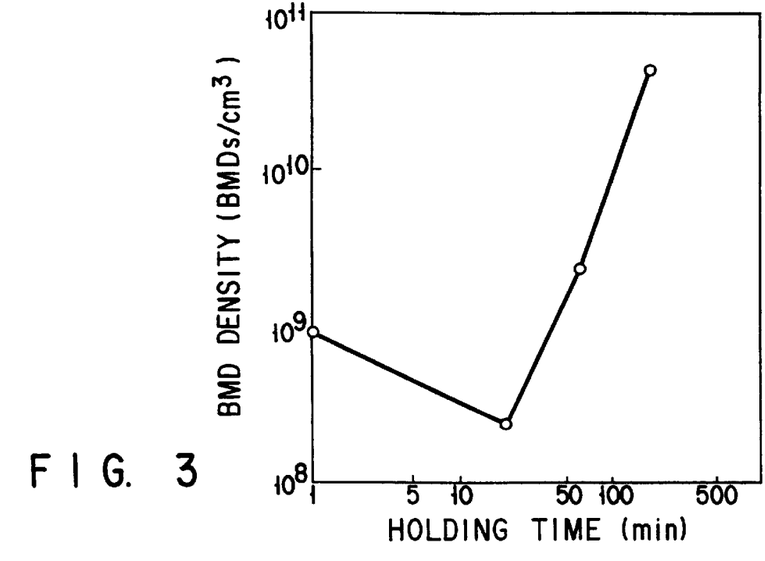
FIG. 3 is a graph showing the relationship between the holding time and a BMD density.

Further, the heat treatment at a high temperature under the argon gas atmosphere has been carried out by changing the holding time, with the boat-in temperature set at 800° C. FIG. 3 shows the result. It has been found that the oxygen precipitate in a surface region of the silicon wafer can be much suppressed if the holding time is set at about 40 minutes. To be more specific, the BMD density is lowered in general with decrease in the holding time. It has been found, however, that the BMD density is increased if the holding time is shorter than a certain level. In this case, the BMD density has been found to increase if the holding time is 20 minutes or less.

Figure 4:
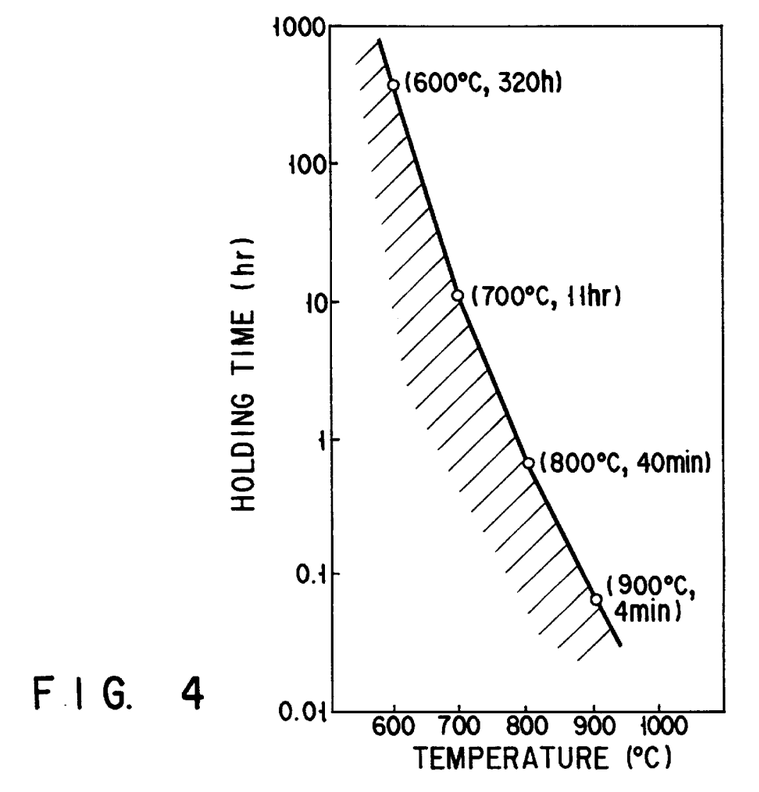
FIG. 4 shows a region where the defect density can be sufficiently suppressed, said region being defined by a heat treating temperature and a heat treating time.

FIG. 4 shows a region where the BMD density can be sufficiently suppressed, said region being defined by a heat treating temperature and a heat treating time. To be more specific, the BMD density can be sufficiently suppressed if the heat treatment is carried out within the region shaded in the graph of FIG. 4, said region being defined by a solid line passing through points of (900° C., 4 minutes), (800° C., 40 minutes), (700° C., 11 hours) and (600° C., 320 hours) including the solid line. For example, in the manufacture of a CMOS device having a well structure as described out above, the heat treatment should be applied to the silicon substrate under the conditions falling within the shaped region shown in FIG. 4 before the heat treatment under the non-oxidizing atmosphere at a temperature not lower than 1100° C. In this case, the quality of the silicon substrate can be improved, making it possible to obtain a CMOS device exhibiting excellent characteristics.

It is considered reasonable to understand that the particular heat treatment defined in the present invention permits silicon atoms to be preferentially introduced into regions within lattices of the silicon crystal of the substrate so as to prevent substantially completely the oxygen atoms from being precipitated within the particular regions noted above. At the same time, the oxygen atoms within the silicon substrate are considered to be diffused outward, with the result that the oxygen concentration within lattices in a surface region of the silicon substrate is lowered without bringing about oxygen precipitate. Further, the micro defects are repaired by the heat treatment under the non-oxidizing atmosphere so as to further promote the outer diffusion of oxygen, leading to the prominent effect described previously.

Figure 5:
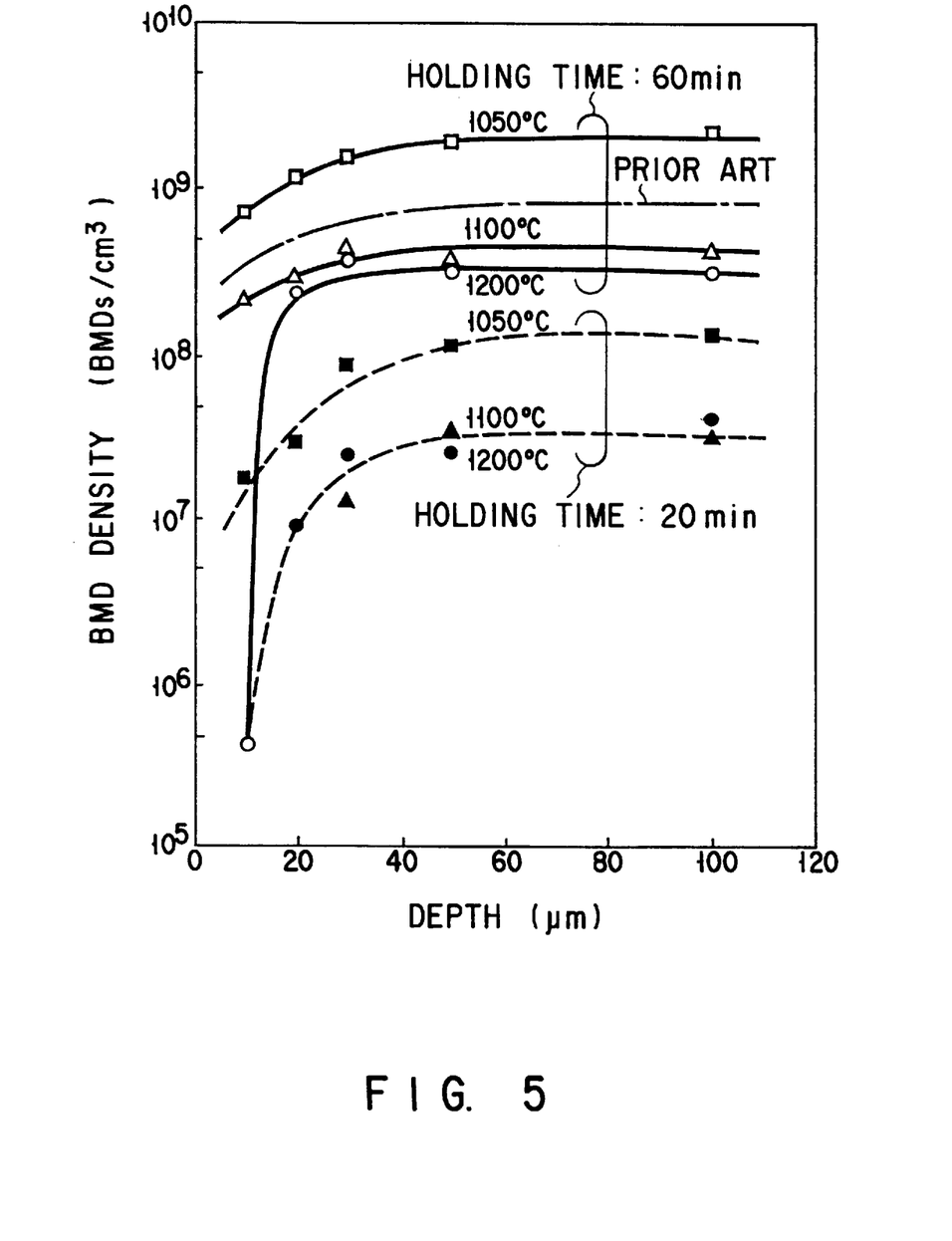
FIG. 5 is a graph showing the relationship among the depth, a BMD density and a heat treating time.

FIG. 5 shows the relationship between the depth from the wafer surface and the BMD density. It is seen that, under the holding time of 20 minutes, the heat treatment at a temperature not lower than 1100° C., which is carried out under a non-oxidizing atmosphere, permits effectively controlling the BMD in a surface region of the silicon wafer at a low density. To be more specific, the heat treatment specified in the present invention makes it possible to obtain a semiconductor substrate, comprising a first region defined between the upper surface and a plane having a depth of 10 μm as measured from the upper surface, said first region having a defect (BMD) density not higher than $10^7$ defects/cm$^3$, and a second region defined between the bottom surface and a plane having a depth of 50 μm as measured from the upper surface, said second region having a constant defect density falling within a range of between $10^7$ defects/cm$^3$ and $10^9$ defects/cm$^3$, the defect density within the region positioned between said first and second regions being distributed such that the defect density is decreased with decrease in the distance from the upper surface.

A surface region of a silicon wafer, to which was applied the heat treatment specified in the present invention, was oxidized at 950° C. to form an oxide film having a thickness of 20 nm, thereby preparing capacitors. Likewise, additional capacitors were prepared by using a conventional silicon wafer to which the heat treatment specified in the present invention was not applied. Each of the capacitors thus prepared was evaluated by applying an electric field of an intensity not higher than 8 MV/cm. The capacitors prepared by using the conventional silicon wafer were found to be broken upon application of the electric field, the ratio of breakage being as high as 20 to 60%. On the other hand, the capacitors with a poor breakdown voltage were found to be only several % when it comes to the capacitors prepared by using the silicon wafer to which a heat treatment had been applied at 1100° C. or more as specified in the present invention.

As described above, it is important to apply a heat treatment to a silicon wafer under conditions falling within the shaded region shown in FIG. 4, followed by further applying a heat treatment to the silicon wafer at a temperature not lower than 1100° C. under a non-oxidizing atmosphere such as an argon gas atmosphere. The particular treatment specified in the present invention makes it possible to suppress the OSF generation and, at the same time, to prevent nonuniform distribution of oxygen precipitates generated in a surface region of the silicon wafer. It follows that it is possible to improve the poor breakdown voltage of the oxide film. Incidentally, the heat treatment was carried out for 4 hours in the embodiment described above. However, similar effects can be obtained as far as the particular heat treatment is carried out for at least one hour.

It should be noted that, where a heat treatment is carried out for an unduly long time, the amount of oxygen precipitate within the silicon wafer is increased, giving rise to the problems that the silicon wafer is warped during the process and that the stress margin is lowered in respect of the heat treating steps included in the process. It has been experimentally confirmed by the present inventors that, if oxygen is precipitated within the silicon wafer in an amount exceeding $2 \times 10^7$ atoms/cm$^3$ by the heat treatment which is carried out under a non-oxidizing atmosphere, crystal defects are generated within the silicon wafer, leading to deterioration of the element characteristics. To overcome the difficulty, it is necessary to select the heat treating conditions which permit the oxygen concentration in a surface region of the silicon wafer to be $1 \times 10^{17}$ atoms/cm$^3$ or less and which also permit the oxygen concentration in an inner region of the silicon wafer to be $2 \times 10^{17}$ atoms/cm$^3$ or less.

In another embodiment of the present invention, a silicon substrate is treated as follows. In the first step, a silicon substrate is subjected to a heat treatment at a temperature not lower than 1100° C. under an oxidizing atmosphere (100% of dry oxygen) so as to form a silicon oxide film on the surface of the silicon substrate. Silicon atoms are introduced by this heat treatment into regions within crystal lattices inside the silicon substrate, making it possible to suppress the oxygen precipitate within the crystal lattices inside the silicon substrate.

The introduction of the silicon atoms into regions within the crystal lattices is considered to be brought about as follows. Specifically, when a silicon oxide film is formed by the heat treatment at a temperature not lower than 1100° C., re-arrangement of silicon atoms is considered to take place in a surface region of the silicon substrate. What should be noted is that the excess silicon atoms, which were unable to contribute to the re-arrangement because of the expansion accompanying the formation of the silicon oxide film, are migrated into the inner region of the silicon substrate so as to be positioned within the crystal lattices.

In the next step, the silicon oxide film formed on the surface of the silicon substrate is removed, followed by applying a heat treatment to the silicon substrate at 1200° C. for 4 hours under an inert gas atmosphere. Incidentally, it is not absolutely necessary to carry out the particular heat treatment for 4 hours. In general, it suffices to carry out the particular heat treatment for at least one hour.

Figure 6:
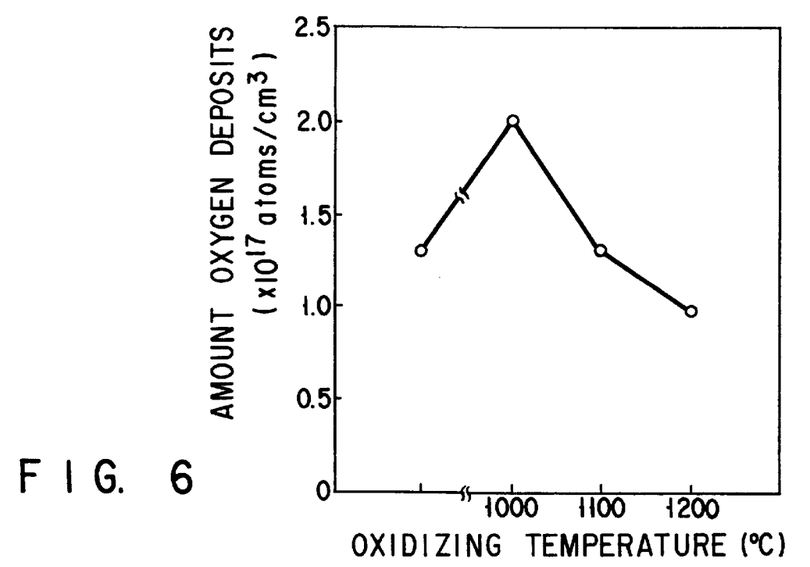
FIG. 6 is a graph showing the relationship between the oxidizing temperature and the amount of precipitated oxygen concentration.

FIG. 6 is a graph showing the relationship between the temperature for the heat treatment under the oxidizing atmosphere (oxidizing temperature) and the amount of precipitated oxygen concentration. It is seen from the graph that, where the oxidizing temperature is at least 1100° C., the amount of the oxygen precipitate is rendered smaller than that in a crude silicon substrate. In other words, FIG. 6 supports that it is necessary to carry out the oxidizing treatment at a temperature not lower than 1100° C.

Figure 7:
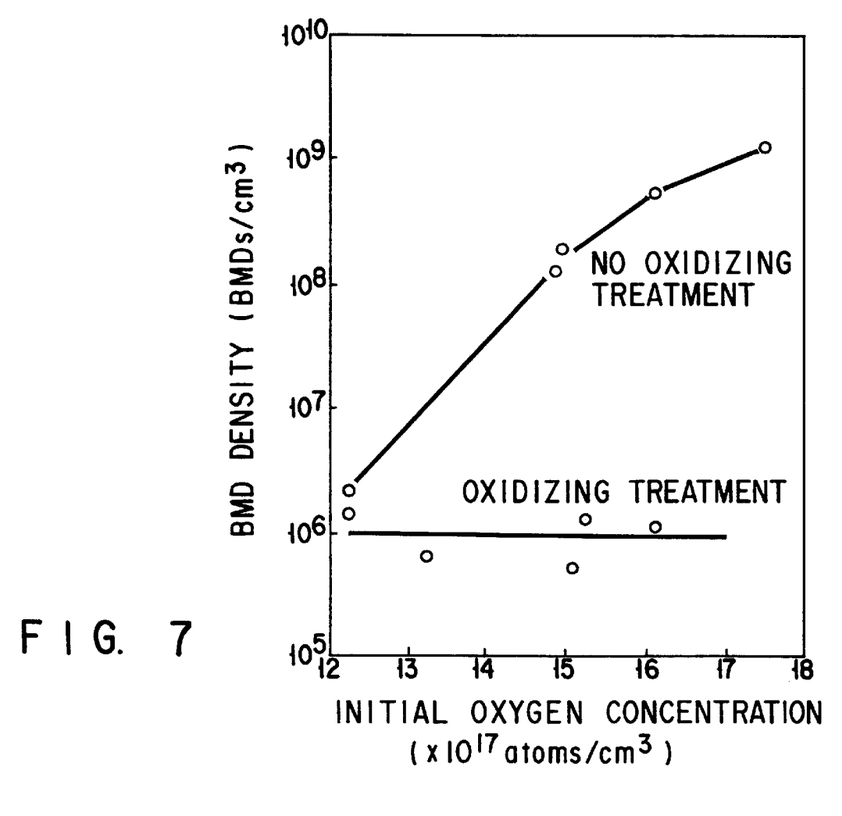
FIG. 7 is a graph showing the relationship between the initial oxygen concentration and a BMD density.

FIG. 7 is a graph showing the relationship between the initial oxygen concentration and the BMD density. Some dots shown in FIG. 7 denote the data on a silicon substrate to which was applied a heat treatment under an oxidizing atmosphere specified in the present invention. To be more specific, these dots cover the case where a silicon substrate, which had been subjected to a heat treatment at 1200° C. for one hour under an oxidizing atmosphere, was subjected to a heat treatment at 1200° C. for one hour under an argon gas atmosphere. On the other hand, other dots shown in FIG. 7 denote the data on a silicon substrate to which a heat treatment was not applied under an oxidizing atmosphere at 1200° C. To be more specific, these dots cover the case where a silicon substrate was simply subjected to a heat treatment an argon gas atmosphere.

As apparent from FIG. 7, the heat treatment at 1200° C. under an oxidizing atmosphere permits the BMD density to be maintained low regardless of the initial oxygen concentration. On the other hand, the BMD density is increased with increase in the initial oxygen concentration in the case where the heat treatment under an oxidizing atmosphere is not applied to the silicon wafer. In other words, the experimental data given in FIG. 7 support that the heat treatment under an oxidizing atmosphere is absolutely necessary for lowering the BMD density.

Figure 8:
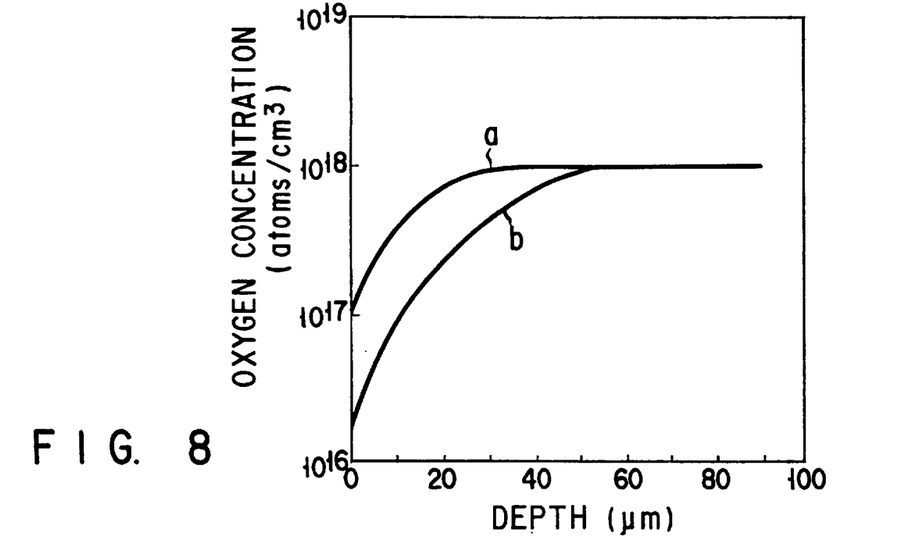
FIG. 8 is a graph showing the relationship between the depth and the oxygen concentration.

FIG. 8 is a graph showing the relationship between the depth from the surface of a silicon substrate and the oxygen concentration. Curve a covers the relationship before application of the heat treatment under an inert gas atmosphere to the silicon wafer which had been subjected to the heat treatment under an oxidizing atmosphere. On the other hand, curve b covers the relationship after application of the particular heat treatment. As apparent from FIG. 8, the oxygen concentration in the surface region of the silicon substrate, which is high as a whole immediately after application of the heat treatment under an oxidizing atmosphere, is rendered low as a whole, by the subsequent heat treatment under an inert gas atmosphere. It should be noted that the heat treatment under an inert gas atmosphere causes the oxygen atoms in the surface region of the silicon substrate to be diffused outward so as to lower the oxygen concentration in the surface region of the silicon substrate.

Figure 9:
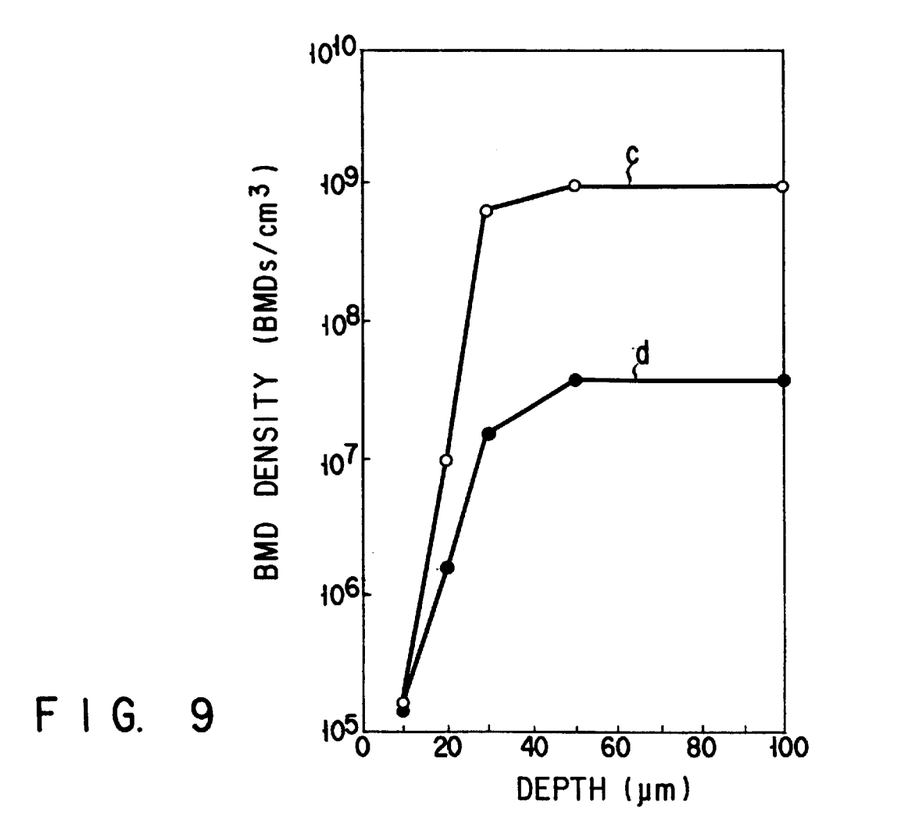
FIG. 9 is a graph showing a BMD density distribution in conjunction with a heat treatment

FIG. 9 shows the effect produced by the heat treatment applied to the silicon substrate under an inert gas atmosphere. To be more specific, FIG. 9 shows the relationship between the depth from the surface of the silicon substrate and the BMD density. Curve c shown in FIG. 9 covers the case where the heat treatment under an inert gas atmosphere is not applied to the silicon substrate, with curve d covering the case of applying the particular heat treatment to the silicon substrate. As apparent from FIG. 9, the BMD density can be sufficiently lowered by the heat treatment under an inert gas atmosphere. As pointed out previously, the heat treatment under an inert gas atmosphere causes the oxygen atoms in a surface region of the silicon substrate to be diffused outward so as to collapse the BMD in a surface region of the silicon substrate, leading to the marked reduction of the BMD density as shown in FIG. 9. Incidentally, OSF is also collapsed in the step of applying a heat treatment to the silicon substrate under an inert gas atmosphere.

In order to evaluate the BMD in a silicon oxide film and in a surface region of a silicon substrate, the present inventors prepared capacitors by oxidizing a surface region of a silicon substrate, to which a heat treatment had been applied in advance under an inert gas atmosphere, at 950 ° C. to form an oxide film having a thickness of 20 nm on the surface of the silicon substrate. It has been found that, where the heat treatment under an oxidizing atmosphere is carried out at a temperature not lower than 1100° C., it is possible to control effectively the BMD density in the silicon oxide film and in the surface region of the silicon substrate at a sufficiently low level. Also, an electric field of an intensity not higher than 8 MV was applied to the capacitor in an attempt to examine the breakdown voltage of the capacitor. A breakage ratio has been found to be only several %.

For comparison, additional capacitors were prepared by using a conventional silicon substrate to which a heat treatment had not been applied in advance under an oxidizing atmosphere. In this case, an electric field of an intensity not higher than 8 MV was also applied to the capacitor in an attempt to examine the breakdown voltage of the capacitor. A breakage ratio has been found to be as high as 20 to 60%.

As described above, a heat treatment is applied in this embodiment to a silicon substrate at 1100° C. under an oxidizing atmosphere, followed by applying an additional heat treatment to the silicon substrate under an inert gas atmosphere at 1200° C., with the result that it is possible to suppress the generation of BMD and OSF, which cause deterioration of the element characteristics, without bringing about reduction in the mechanical strength of the silicon substrate.

In this case, temperatures of heat treatments under an oxidizing atmosphere and an inert gas atmosphere are both preferably not lower than 1100° C. Under an inert gas atmosphere, the temperature not lower than 1200° C. is more preferable.

In still another embodiment of the present invention, a silicon substrate is processed as follows. In the first step, an oxide film is formed on a silicon substrate by means of, for example, a thermal oxidation method or a CVD method. Then, the silicon substrate is subjected to a heat treatment at a temperature not lower than 1100° C. under a non-oxidizing atmosphere such as a nitrogen gas atmosphere. Finally, the oxide film formed on the silicon substrate is removed, followed by subjecting the silicon substrate to a heat treatment under an inert gas atmosphere such as an argon gas atmosphere.

In the embodiment described above, silicon atoms are introduced into regions between the crystal lattices within the silicon substrate by the heat treatment carried out at a temperature not lower than 1100° C. under a non-oxidizing atmosphere such as a nitrogen gas atmosphere. At the same time, oxygen atoms within the silicon substrate are diffused to the outside, with the result that the amount of the oxygen precipitate can be diminished sufficiently. It follows that the prominent effect similar to that described previously can also be produced in this embodiment.

The present invention is not restricted to the embodiments described above. For example, an argon gas atmosphere is used as a non-oxidizing atmosphere in the embodiments described above. However, an inert gas atmosphere other than an argon gas atmosphere or a hydrogen gas atmosphere can also be used in place of the argon gas atmosphere, with substantially the same effect. Of course, various modifications can be employed within the technical scope of the present invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of processing a semiconductor substrate, comprising the steps of subjecting a semiconductor substrate to a heat treatment at a temperature not lower than 1100° C. under an oxidizing atmosphere so as to form an oxide film on the surface of said semiconductor substrate; followed by removing said oxide film to expose the surface of said semiconductor substrate, followed by subjecting the semiconductor substrate with the exposed surface to a heat treatment under a non-oxidizing atmosphere for at least one hour.

2. The method of processing a semiconductor substrate according to claim 1, wherein said heat treatment under a non-oxidizing atmosphere is carried out at a temperature not lower than 1200° C. for at least one hour under a non-oxidizing atmosphere.

3. The method of processing a semiconductor substrate according to claim 1, wherein said heat treatment under a non-oxidizing atmosphere is carried out under an inert gas atmosphere.

4. The method of processing a semiconductor substrate according to claim 3, wherein the concentration of said oxygen gas, nitrogen gas or a carbon-based gas in said inert gas atmosphere is not higher than 1 ppb.

5. The method of processing a semiconductor substrate according to claim 1, wherein said heat treatment under a non-oxidizing atmosphere is carried out under a hydrogen gas atmosphere.

6. The method of processing a semiconductor substrate according to claim 2, wherein said heat treatment under a non-oxidizing atmosphere is carried out under an inert gas atmosphere.

7. The method of processing a semiconductor substrate according to claim 2, wherein said heat treatment under a non-oxidizing atmosphere is carried out under a hydrogen gas atmosphere.

8. The method of processing a semiconductor substrate according to claim 6, wherein the concentration of said oxygen gas, nitrogen gas or a carbon-based gas in said inert gas atmosphere is not higher than 10 ppb.

* * * * *